United States Patent [19]
Burgess et al.

[11] Patent Number: 5,408,428
[45] Date of Patent: Apr. 18, 1995

[54] PROGRAMMABLE BIT CELL

[75] Inventors: Bradley Burgess; Jeffrey Slaton, both of Austin, Tex.

[73] Assignee: Motorola, Inc., Schaumburg, Ill.

[21] Appl. No.: 176,811

[22] Filed: Jan. 3, 1994

[51] Int. Cl.6 .............................................. G11C 17/00
[52] U.S. Cl. .................................................... 365/94
[58] Field of Search ................. 365/94, 244, 45, 51, 365/63

Primary Examiner—Joseph A. Popek
Attorney, Agent, or Firm—Lee E. Chastain

[57] ABSTRACT

A mask-programmable read only memory bit cell (16) has a pair of conductive elements for each conductive layer in the integrated device but the last layer (30 and 34, 38 and 42, 46 and 50) and single conductive element in the last layer (54). The first and second elements in the first pair of elements receive a first and a second voltage supply ($V_{DD}$ and $V_{GND}$), respectively. The single element outputs a voltage corresponding to the logic state stored by the bit cell. A plurality of pairs of conductive vias couple particular ones of the elements in each layer to particular ones of the elements in adjacent layers. The logic state stored by the bit cell may be reversed by reversing the connection of any one pair of elements and its associated vias. This makes the bit cell suitable for use in a processor version register.

8 Claims, 4 Drawing Sheets

PROGRAMMABLE BIT CELL

FIELD OF THE INVENTION

The present invention generally relates to digital storage systems, and more specifically to a programmable bit cell.

BACKGROUND OF THE INVENTION

Read only memories ("ROMs") are non-volatile, non-programmable semiconductor storage devices. ROMs are widely used in electronic systems. For instance, data processors use onboard ROMs to store instruction microcode. Data processing systems use ROMs to store a portion of the system's software operating system necessary at start-up. Various devices, when implemented as integrated circuits, use ROMs to store an identification number of the device, a "device version register." The contents of a version register may be used to determine specific operating characteristics of a particular device that is otherwise identical to a number of other devices.

A mask-programmable ROM is a particular type of ROM whose data is programmed once at manufacture and can not be changed during the operation of the device. The logic state of each bit in the ROM is determined by the combination and pattern of conductive layers, insulative layers, and interconnecting vias. Generally, the combination and pattern of conductive layers, insulative layers, and interconnecting vias connect the output port of the bit cell to a first voltage supply if the logic state of the bit corresponds to a first state. Conversely, the combination and pattern of conductive layers, insulative layers, and interconnecting vias connect the output port of the bit cell to a second voltage supply if the logic state of the bit corresponds to a second state.

One important characteristic of mask-programmable ROMs is the ease with which the contents of the ROM may be changed, i.e. how many of the various patterns of conductive layers, insulative layers, and interconnecting vias must be changed to flip a single bit from the first logic state to the second logic state, or vice versa. It is also an important feature if an individual bit may be flipped backed to its initial logic state after an intermediate change.

An integrated circuit version register has additional requirements given its peculiar purpose. Typically, the version register is incremented each time the manufacturer changes the design of any one or more layers of the device. Therefore, it is important to be able to change the value stored in the version register by changing the patterns of any single layer of the integrated circuit. If this criteria is satisfied, then the manufacturer may update the version register even when making the smallest change to the device. If this criteria is not met, then the manufacturer must make additional design changes to the device simply to update the version register.

SUMMARY OF THE INVENTION

In accordance with the present invention, there is disclosed a programmable bit cell having a design which substantially eliminates disadvantages of prior mask-programmable bit cells.

A programmable bit cell has a first pair of conductive elements, a second pair of conductive elements, and a single conductive element in a first, a second and a third layer, respectively. Each element has a first and a second end. The bit cell also has a first and a second pair of conductive vias. The first ends of the first and second elements in the first pair receive a first and a second voltage supply, respectively. The first pair of vias couple the second ends of the of the first and second elements in the first pair to the first ends of the first and second elements in the second pair, respectively. The first via in the second pair of vias couples the second end of the first element in the second pair of elements to the second end of the single conductive element. The second via in the second pair of vias is coupled to the second end of the second element in the second pair of elements. The first end of the single element outputs a voltage corresponding to a logic state stored by the bit cell.

BRIEF DESCRIPTION OF THE DRAWINGS

The features and advantages of the present invention will be more clearly understood from the following detailed description taken in conjunction with the accompanying FIGURES where like numerals refer to like and corresponding parts and in which.

DETAILED DESCRIPTION OF A PREFERRED EMBODIMENT

Figure 1:
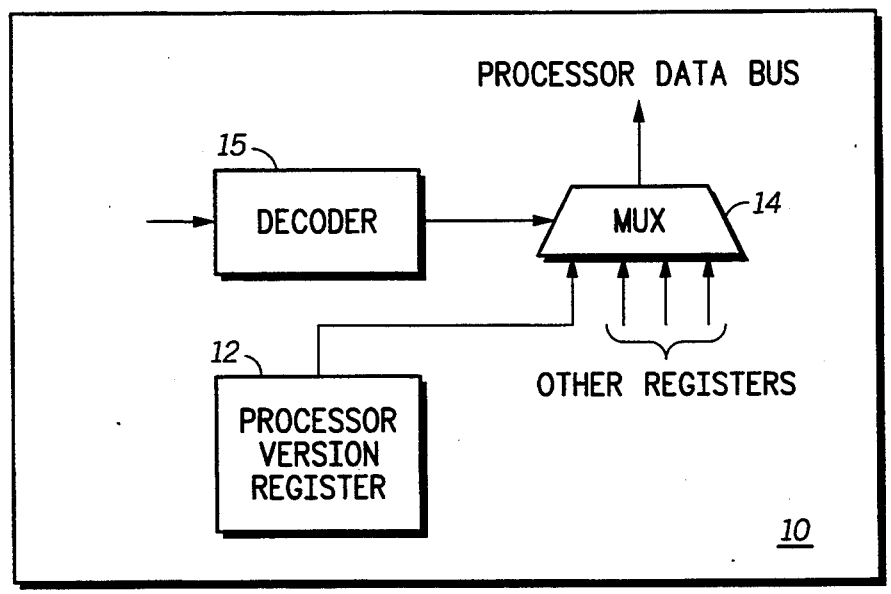
FIG. 1 depicts a block diagram of a data processor constructed in accordance with the present invention.

FIG. 1 depicts a block diagram of a data processor 10 constructed in accordance with the present invention. Data processor 10 has a processor version register ("PVR") 12 that stores information identifying the design iteration of data processor 10. PVR 12 itself is constructed with a plurality of mask-programmable ROM bit cells. The number of expected versions of data processor 10 determines the particular number of the bits cells. In the depicted embodiment, data processor 10 is constructed with four layers alternating layers of metal and insulative material on top of various metal oxide semiconductor ("MOS") transistors fabricated on a silicon substrate. Each PVR bit cell is built from a combination of patterns within the four conductive metal layers and the interconnecting vias such that the stored logic state may be reversed by making a change in any single one metal layer. No change to the pattern of interconnecting vias is required. Also, any such single layer change may be reversed at a later time by modifying the same single layer or by making a change in any other single layer. Therefore, the value stored by PVR 12 may be changed given any likely design revision to data processor 10.

Continuing with FIG. 1, a multiplexer 14 (labeled "MUX") is coupled to PVR 12 and to other registers within data processor 10. A decoder 15 receives program instructions and selects one of the registers coupled to multiplexer 14 responsive to the instructions. The contents of a selected register, including the contents of PVR 12, may then be internally manipulated when it is output on an internal processor data bus. In the case of PVR 12, data processor 10 may use the information contained therein to select certain preprogrammed code if, for instance, certain portions of data processor 10 do not operate in early design versions.

Figure 2:
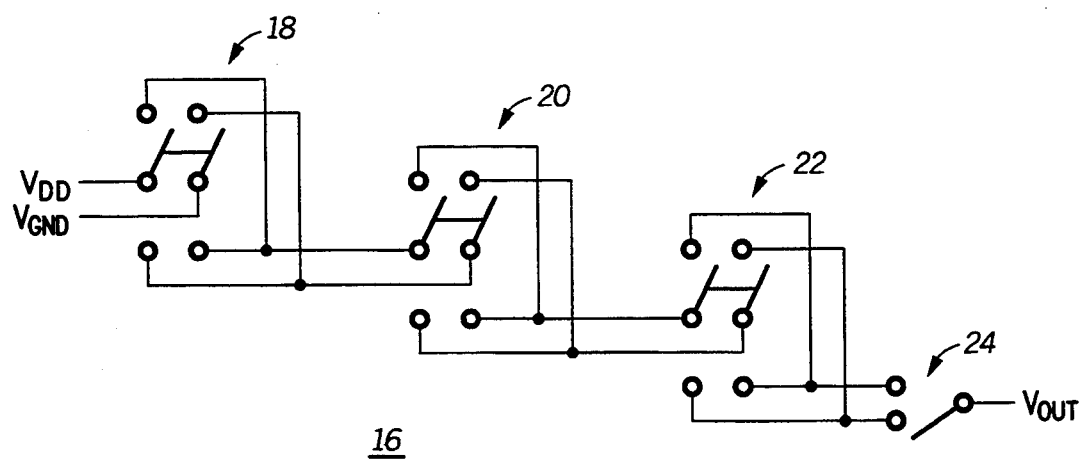
FIG. 2 depicts a schematic diagram of an individual bit cell of the processor version register depicted in FIG. 1.

FIG. 2 depicts a schematic diagram of an individual bit cell 16 of PVR 12 depicted in FIG. 1. Conceptually, bit cell 16 has a double-pole/double-throw switch ("DPDT switch") for each metal layer but the last and a double-pole/single-throw ("DPST switch") switch for the final layer of metal. First DPDT switch 18 receives a first and a second voltage level ($V_{DD}$ and $V_{GND}$, respectively) corresponding to a first and second logic state, respectively, at its first and second input terminals, respectively. The first and second output terminals of DPDT switch 18 are connected to the first and second input terminals of DPDT switch 20. Similarly, the first and second output terminals of DPDT switch 20 are connected to the first and second input terminals of DPDT switch 22 Finally, the first and second output terminals of DPDT switch 22 are connected to the first and second input terminals of DPST switch 24. The single output pole of DPST switch 24 delivers the voltage level corresponding to the logic state of bit cell 16 (labeled $V_{OUT}$).

In the depicted embodiment, DPDT switch 18 and DPST switch 24 are implemented in the metal layers nearest to and farthest away from the silicon substrate (not shown), respectively. However, it should be understood that this particular order may be reversed.

As indicated by FIG. 2, the logic state output by bit cell 16 depends upon how each switch connects its input terminals to its output terminals (or terminal). Each DPDT switch can connect either (1) its first input terminal to its first output terminal and its second input terminal to its second output terminal, or (2) its first input terminal to its second output terminal and its second input terminal to its first output terminal. The single DPST switch can connect either (1) its first input terminal to its output terminal or (2) its second output terminal to its first output terminal. Therefore, for N layers, there are $2^N$ possible configurations of bit cell 16, where N is an integer. Half of these $2^N$ possible configurations generate an output voltage corresponding to the first logic state. The other half of these $2^N$ possible configurations generate an output voltage corresponding to the second logic state. For instance, if each switch is configured such that the input terminals are connected to the output terminals that are closest to the switch arms as depicted, then $V_{OUT}$ will equal $V_{GND}$. However, the value of $V_{OUT}$ may be reversed by switching any single switch. Similarly, any previous change may be nullified by again reversing the previously reversed switch or by reversing any other single switch.

It should be understood that both arms in each switch must be initially connected and both must be subsequently reversed to ensure the full range of programmability of bit cell 16. For instance, if bit cell 16 is to initially output a logic state corresponding to the voltage level $V_{DD}$, then the voltage level $V_{GND}$ must also be coupled to the unselected arm in DPST switch 24 through the unselected poles in switches 18, 20 and 22. Otherwise, it would not be possible to reverse the output voltage of bit cell 16 at a later time by modifying a different layer.

Figure 3:
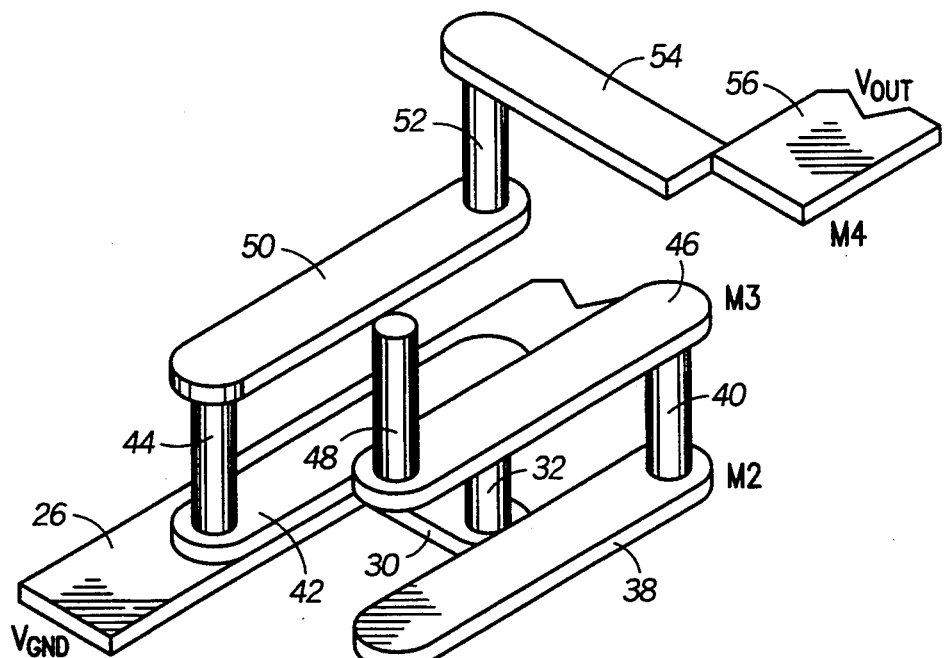
FIG. 3 depicts an isometric diagram of a first configuration of the individual bit cell depicted in FIG. 2.

FIG. 3 depicts an isometric diagram of a first configuration of the individual bit cell 16 depicted in FIG. 2. Bit cell 16 is fabricated in the metal layers used to connect each transistor in data processor 10 to each other transistor, to two power supply rails, to one or more clocking signals and to various other control signals. In the depicted embodiment, data processor has four metal layers (M1, M2, M3 and M4) separated by from one another by three or more insulating layers (not shown). Each of the seven layers is generally planar with respect to the other layers. However, the disclosed invention may be extended to integrated devices having more or less than four metal layers. Also, it is not a requirement that each layer be metal. Bit cell 16 was fabricated exclusively in the metal layers because the designers believed that the smallest design revision to data processor 10 would also involve changes to at least one metal layer. Therefore, the value stored in PVR 12 could be changed to reflect the smallest design change by changing the layout of the bit cell in the at least one metal layer.

Continuing with FIG. 3, bit cell 16 has a first power bus 26 and a second power bus 28 for routing the voltage supplies $V_{GND}$ and $V_{DD}$, respectively, across data processor 10. A first conductive element or "strap" 30 in M1 connects power bus 26 to a via 32. Similarly, a second conductive element or "strap" 34 in M1 connects power bus 28 to a via 36. In general, vias electrically connect two conductive layers which are partially above and below each other in the horizontal plane but which are in adjacent metal layers. In this case, vias 32 and 36 connect aligned conductive elements in M1 and M2 together. A first conductive element or "strap" 38 in M2 connects via 32 to a via 40. Similarly, a second conductive element or "strap" 42 in M2 connects via 36 to a via 44. Vias 40 and 44 connect aligned conductive elements in M2 and M3 together. A first conductive element or "strap" 46 in M3 connects via 40 to a via 48. Similarly, a second conductive element or "strap" 50 in M2 connects via 44 to a via 52. Vias 48 and 52 connect aligned conductive elements in M3 and M4 together. Finally, a first conductive element or "strap" 54 in M4 connects via 52 to an output terminal 56. The configuration of bit cell 16 depicted in FIG. 3 outputs the logic state corresponding to the voltage supply $V_{GND}$.

Power buses 26 and 28, straps 30, 34, 38, 42, 46, 50 and 54 and vias 32, 36, 40, 44, 48 and 52 are fabricated according to known methods. The sizes of the depicted straps and vias are a function of whatever process is used to manufacture bit cell 16. No particular shape, size ratio, layer thickness or spacing is required according to the disclosed invention. The vias are fabricated in layers which are formed between two particular metal layers. In general, that portion of the volume of the metal and via layers which is not occupied by a strap or by a via is occupied by a volume of insulative material, such as $SiO_2$. This insulative material is not depicted to more clearly illustrate the invention.

Figure 4:
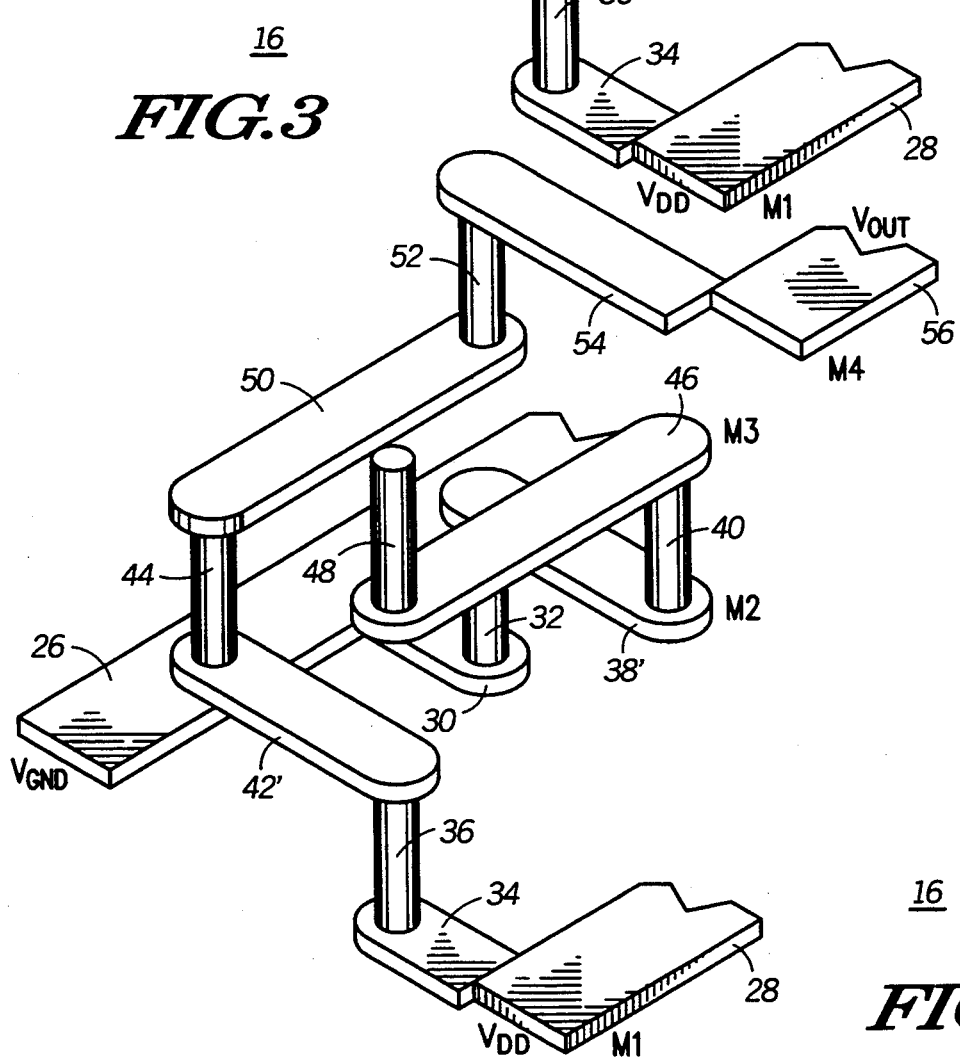
FIG. 4 depicts an isometric diagram of a second configuration of the individual bit cell depicted in FIG. 2.

FIG. 4 depicts an isometric diagram of a second configuration of bit cell depicted 16 in FIG. 2. This configuration illustrates how the logic state of bit cell 16 may be reversed with respect to the first configuration by modifying straps in M2 only. Here, first strap 38 has been redesigned so that it connects vias 32 and 40. It is labeled 38' in FIG. 4. Similarly, second strap 42 has been redesigned so that it connects vias 36 and 44. It is labeled 42' in FIG. 4. This second configuration of bit cell 16 outputs the logic state corresponding to the voltage supply $V_{DD}$.

Figure 5:
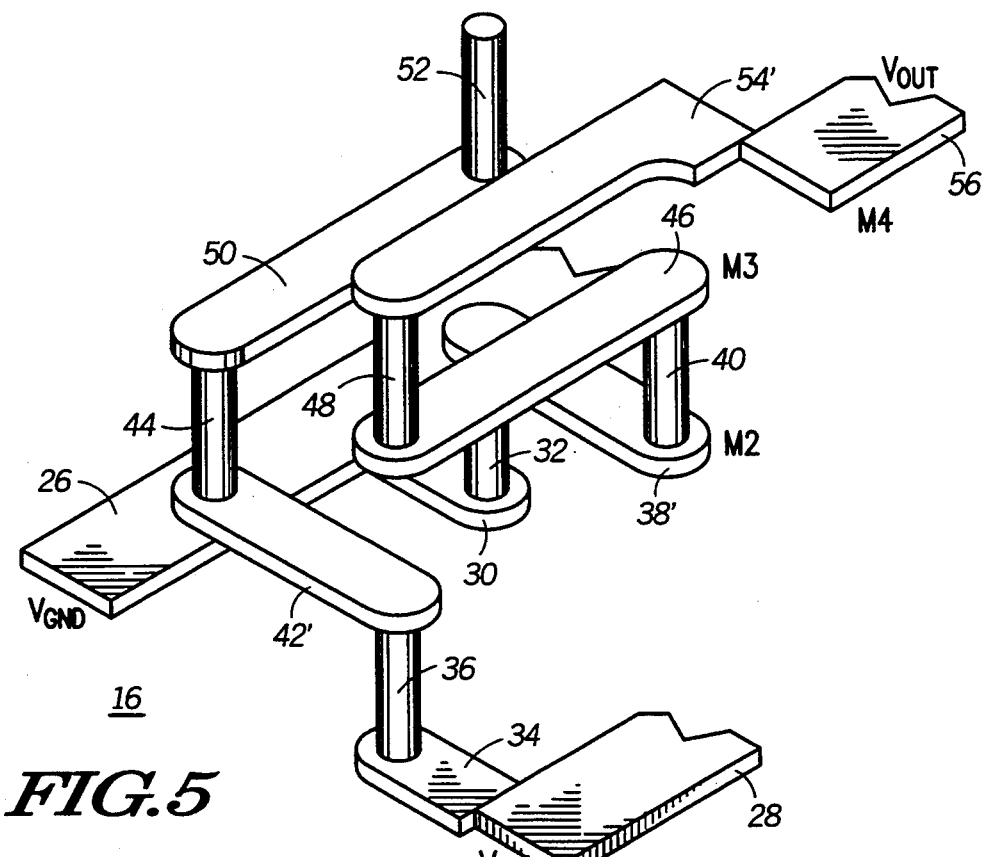
FIG. 5 depicts an isometric diagram of a third configuration of the individual bit cell depicted in FIG. 2.

FIG. 5 depicts an isometric diagram of a third configuration of bit cell 16 depicted in FIG. 2. This configuration illustrates how the logic state of bit cell 16 may be reversed with respect to the second configuration by modifying straps in M4 only. Here, first strap 54 has been redesigned so that it connects output terminal 56 to via 48. It is labeled 54' in FIG. 5. This third configuration of bit cell 16 outputs the logic state corresponding to the voltage supply $V_{GND}$.

Figure 6:
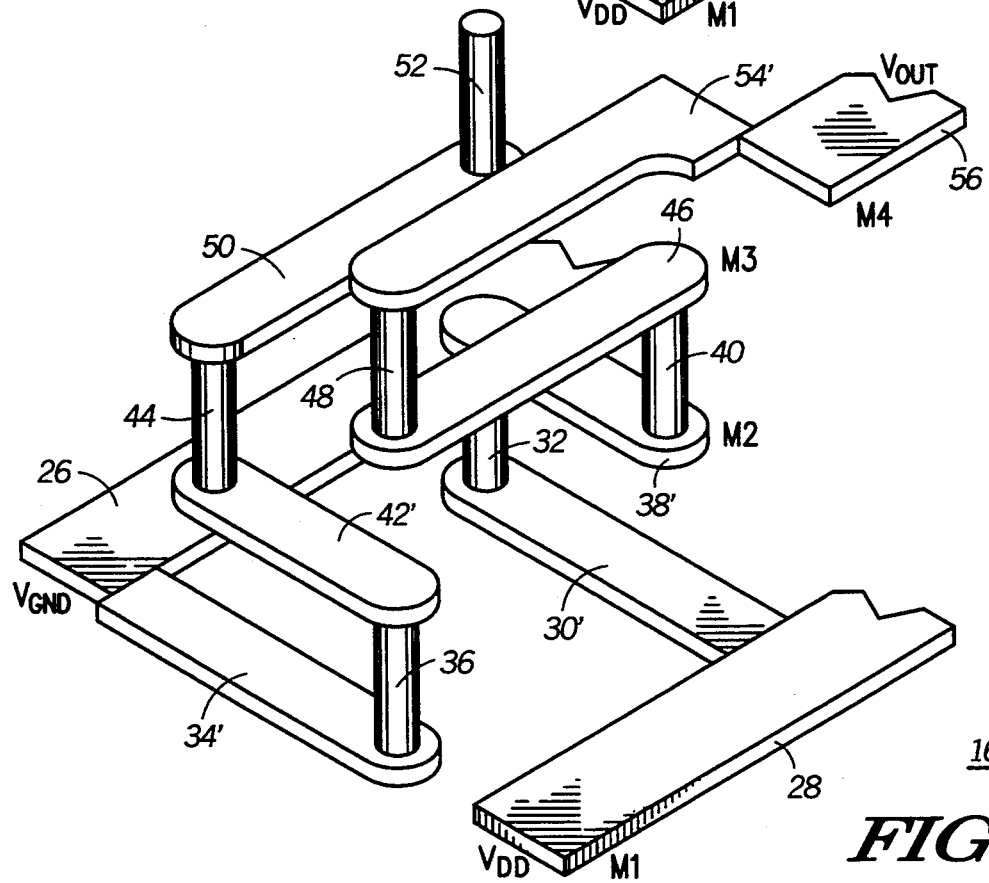
FIG. 6 depicts an isometric diagram of a fourth configuration of the individual bit cell depicted in FIG. 2.

FIG. 6 depicts an isometric diagram of a fourth configuration of bit cell 16 depicted in FIG. 2. This configuration illustrates how the logic state of bit cell 16 may be reversed with respect to the third configuration by modifying straps in M1 only. Here, first strap 30 has been redesigned so that it connects power bus 28 and via 32. It is labeled 30' in FIG. 6. Similarly, second strap 34 has been redesigned so that it connects power bus 28 and via 36. It is labeled 34' in FIG. 6. This fourth configuration of bit cell 16 outputs the logic state corresponding to the voltage supply $V_{DD}$.

Figure 7:
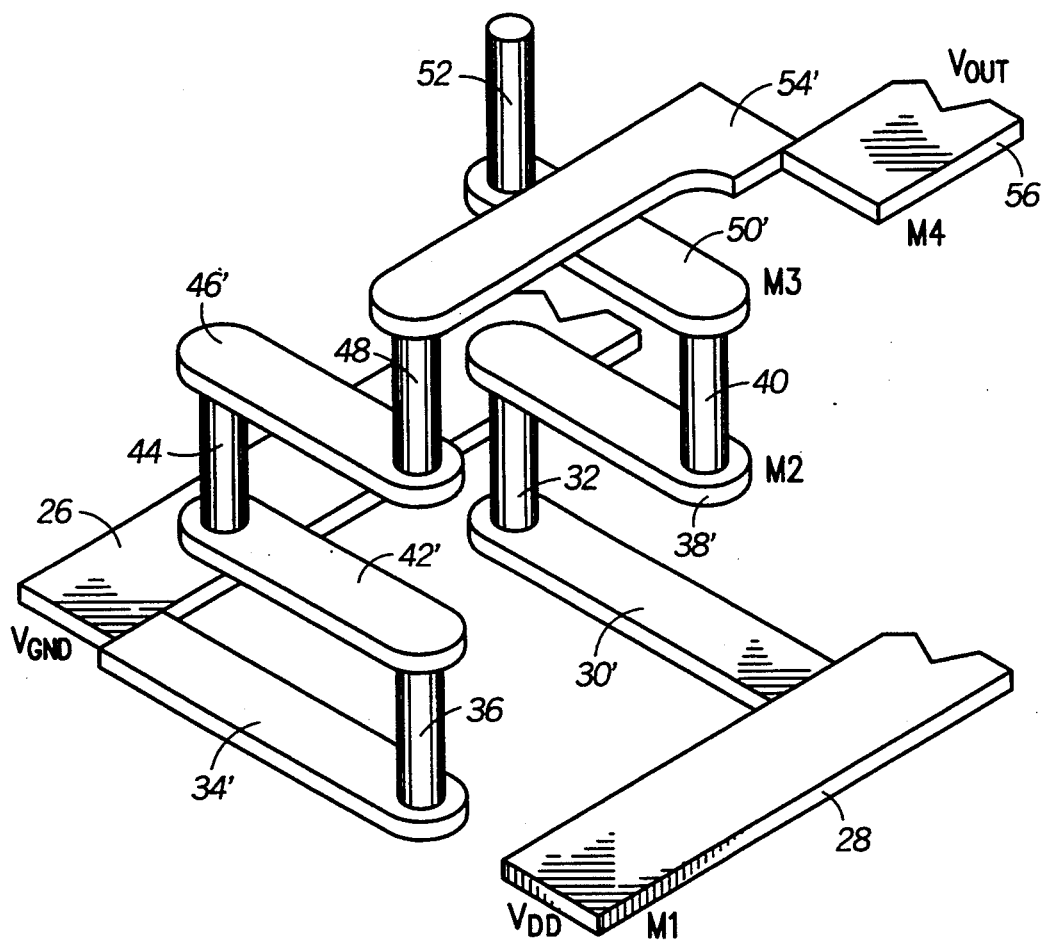
FIG. 7 depicts an isometric diagram of a fifth configuration of the individual bit cell depicted in FIG. 2.

FIG. 7 depicts an isometric diagram of a fifth configuration of bit cell 16 depicted in FIG. 2. This configuration illustrates how the logic state of bit cell 16 may be reversed with respect to the fourth configuration by modifying the straps in M3 only. Here, first strap 46 has been redesigned so that it connects vias 44 and 48. It is labeled 46' in FIG. 7. Similarly, second strap 50 has been redesigned so that it connects vias 40 and 52. It is labeled 50' in FIG. 4. This fifth configuration of bit cell 16 outputs the logic state corresponding to the voltage supply $V_{GND}$.

As described above, there are sixteen ($2^4$) configurations for the depicted four layer structure bit cell. Eight of these configurations output the logic state corresponding to the voltage supply $V_{GND}$. Each of these eight configurations are functionally identically. If the initial logic state corresponds to the voltage supply $V_{GND}$, then any one of these eight may be used. The other eight configurations output the logic state corresponding to the voltage supply $V_{DD}$. Each of these eight configurations are functionally identically. If the initial logic state corresponds to the voltage supply $V_{DD}$, then any one of these eight may be used. It is only after an initial configuration is selected and after a metal layer revision is required, that a specific configuration is mandated.

Although the present invention has been described with reference to a specific embodiment, further modifications and improvements will occur to those skilled in the art. For instance, the configuration of bit cell 16 need not be stacked ("stacked vias") in the vertical plane as depicted. This characteristic simply reduces the size of the bit cell. Also, bit cell 16 may be fabricated in any three or more layers of conductive material. It is to be understood therefore, that the invention encompasses all such modifications that do not depart from the spirit and scope of the invention as defined in the appended claims.

What is claimed is:

1. A bit cell outputting one of a first logic state or a second logic state, the bit cell programmable at manufacture by the modification of a single layer within the bit cell, the bit cell comprising:

a first electrically conductive element disposed in a first plane, the first electrically conductive element comprising a first and a second end, the first end receiving a first voltage supply, the first voltage supply corresponding to a first logic state;

a second electrically conductive element disposed in the first plane, the second electrically conductive element comprising a first and a second end, the first end receiving a second voltage supply, the second voltage supply corresponding to a second logic state;

a first electrically conductive element disposed in a second plane, the first electrically conductive element comprising a first and a second end;

a second electrically conductive element disposed in the second plane, the second electrically conductive element comprising a first and a second end;

a first electrically conductive element disposed in a third plane, the first electrically conductive element comprising a first and a second end, the first end generating an output voltage;

a first electrically conductive via comprising a first and a second end, the first end coupled to the second end of the first electrically conductive element disposed in the first plane, the second end coupled to the first end of the first electrically conductive element disposed in the second plane;

a second electrically conductive via comprising a first and a second end, the first end coupled to the second end of the second electrically conductive element disposed in the first plane, the second end coupled to the first end of the second electrically conductive element disposed in the second plane;

a third electrically conductive via comprising a first and a second end, the first end coupled to the second end of the first electrically conductive element disposed in the second plane, the second end coupled to the second end of the first electrically conductive element disposed in the third plane; and a fourth electrically conductive via comprising a first and a second end, the first end coupled to the second end of the second electrically conductive element disposed in the second plane.

2. The bit cell of claim 1 wherein each of the first electrically conductive elements and each of the second electrically conductive elements are metal.

3. The bit cell of claim 1 further comprising:

a second electrically conductive element disposed in the third plane, the second electrically conductive element comprising a first and a second end, the first end coupled to the second end of the fourth electrically conductive via;

a first electrically conductive element disposed in a fourth plane, the first electrically conductive element comprising a first and a second end, the first end generating the output voltage;

a fifth electrically conductive via comprising a first and a second end, the first end coupled to the first end of the first electrically conductive element disposed in the third plane, the second end coupled to the second end of the first electrically conductive element disposed in the fourth plane; and a sixth electrically conductive via comprising a first and a second end, the first end coupled to the second end of the second electrically conductive element disposed in the third plane.

4. The bit cell of claim 3 wherein each of the first electrically conductive elements and each of the second electrically conductive elements are metal.

5. A data processor comprising:

a processor version register for storing a plurality of data bits identifying the design iteration of the data processor, a differing one of each of the plurality of data bits stored in a differing one of a plurality of bit cells, each one of the plurality of bit cells outputting one of a first logic state or a second logic state, each one of the plurality of bit cells programmable at manufacture by the modification of a single layer, each of the plurality of bit cells comprising:

a first electrically conductive element disposed in a first plane, the first electrically conductive element comprising a first and a second end, the first end receiving one of either a first voltage supply, or a second voltage supply, the first voltage supply corresponding to a first logic state, the second voltage supply corresponding to a second logic state;

a second electrically conductive element disposed in the first plane, the second electrically conductive element comprising a first and a second end, the first end receiving an other one of either the first voltage supply or the second voltage supply;

a first electrically conductive element disposed in a second plane, the first electrically conductive element comprising a first and a second end;

second electrically conductive element disposed in the second plane, the second electrically conductive element comprising a first and a second end;

a first electrically conductive element disposed in a third plane, the first electrically conductive element comprising a first and a second end, the first end generating an output voltage;

a first electrically conductive via comprising a first and a second end, the first end coupled to the second end of the first electrically conductive element disposed in the first plane, the second end coupled to the first end of the first electrically conductive element disposed in the second plane;

a second electrically conductive via comprising a first and a second end, the first end coupled to the second end of the second electrically conductive element disposed in the first plane, the second end coupled to the first end of the second electrically conductive element disposed in the second plane;

a third electrically conductive via comprising a first and a second end, the first end coupled to the second end of the first electrically conductive element disposed in the second plane, the second end coupled to the second end of the first electrically conductive element disposed in the third plane; and a fourth electrically conductive via comprising a first and a second end, the first end coupled to the second end of the second electrically conductive element disposed in the second plane.

6. The data processor of claim 5 wherein each of the first electrically conductive elements and each of the second electrically conductive elements are metal.

7. The data processor of claim 5 wherein each of the plurality of bit cells further comprises:

a second electrically conductive element disposed in the third plane, the second electrically conductive element comprising a first and a second end, the first end coupled to the second end of the fourth electrically conductive via;

a first electrically conductive element disposed in a fourth plane, the first electrically conductive element comprising a first and a second end, the first end generating the output voltage;

a fifth electrically conductive via comprising a first and a second end, the first end coupled to the first end of the first electrically conductive element disposed in the third plane, the second end coupled to the second end of the first electrically conductive element disposed in the fourth plane; and a sixth electrically conductive via comprising a first and a second end, the first end coupled to the second end of the second electrically conductive element disposed in the third plane.

8. The data processor of claim 7 wherein each of the first electrically conductive elements and each of the second electrically conductive elements are metal.

* * * * *